(12) United States Patent
Warren et al.

(10) Patent No.: US 8,289,768 B2
(45) Date of Patent: Oct. 16, 2012

(54) SYSTEMS AND METHODS FOR EXTENDED LIFE MULTI-BIT MEMORY CELLS

(75) Inventors: Robert W. Warren, Loveland, CO (US);
Robb Mankin, Loveland, CO (US);
Buddy Scott Holt, Windsor, CO (US)

(73) Assignee: LSI Corporation, Milpitas, CA (US)

( * ) Notice: Subject to any disclaimer, the term of this patent is extended or adjusted under 35 U.S.C. 154(b) by 350 days.

(21) Appl. No.: 12/691,819

(22) Filed: Jan. 22, 2010

(65) Prior Publication Data

US 2011/0185111 A1    Jul. 28, 2011

(51) Int. Cl.
*G11C 11/34* (2006.01)
(52) U.S. Cl. .......... 365/185.03; 365/185.22; 365/189.16
(58) Field of Classification Search .......... 365/185.03, 365/185.22, 189.16, 151, 230.06, 189.01, 365/236, 185.09, 185.11, 185.18, 185.17, 365/185.24; 711/103, 171, 154, 104
See application file for complete search history.

(56) References Cited

U.S. PATENT DOCUMENTS

| | | |
|---|---|---|
| 7,127,549 B2 | 10/2006 | Sinclair |
| 7,310,699 B2 | 12/2007 | Sinclair |
| 2002/0133781 A1* | 9/2002 | Mikkola et al. ............... 714/790 |
| 2005/0172067 A1 | 8/2005 | Sinclair |
| 2007/0028040 A1 | 2/2007 | Sinclair |
| 2008/0015856 A1* | 1/2008 | Lee ............................ 704/230 |
| 2009/0067303 A1 | 3/2009 | Poo et al. |
| 2009/0172280 A1 | 7/2009 | Trika et al. |
| 2010/0057977 A1* | 3/2010 | Graef ........................... 711/103 |
| 2011/0060861 A1* | 3/2011 | Warren ......................... 711/103 |
| 2011/0060886 A1* | 3/2011 | Warren et al. ................. 711/171 |

FOREIGN PATENT DOCUMENTS

KR    10/2009/0013394    2/2009

OTHER PUBLICATIONS

U.S. Appl. No. 12/473,454, filed May 28, 2009, Dreifus et al.
U.S. Appl. No. 12/691,797, filed Jan. 22, 2010, Warren et al.
U.S. Appl. No. 12/716,257, filed Mar. 2, 2010, Warren, Robert.
U.S. Appl. No. 12/716,259, filed Mar. 2, 2010, Warren, Robert.
U.S. Appl. No. 12/716,262, filed Mar. 2, 2010, Warren, Robert.
U.S. Appl. No. 12/744,055, filed May 5, 2010, Warren, Robert.
U.S. Appl. No. 12/716,265, filed Mar. 2, 2010, Warren, Robert.
U.S. Appl. No. 12/772,005, filed Apr. 3, 2010, Warren, et al.
U.S. Appl. No. 12/774,065, filed May 5, 2010, Warren, Robert.
U.S. Appl. No. 12/774,077, filed May 5, 2010, Warren, Robert.

* cited by examiner

*Primary Examiner* — Dang Nguyen
(74) *Attorney, Agent, or Firm* — Hamilton DeSanctis & Cha

(57) ABSTRACT

Various embodiments of the present invention provide for extended life operation of multi-bit memory cells. As an example, some embodiments of the present invention provide electronic systems that include a plurality of multi-bit memory cells, an encoding circuit and a decoding circuit. Each of the plurality of multi-bit memory cells is operable to hold at least two bits. The encoding circuit is operable to receive a data input including at least two data bits, and to encode the two data bits as an encoded output to the plurality of multi-bit memory cells. The encoded output may be selected to be either a single two bit output representing the two bits, or a series of two two bit outputs representing the two bits. The decoding circuit is operable to reverse the encoding applied by the encoding circuit.

20 Claims, 5 Drawing Sheets

SYSTEMS AND METHODS FOR EXTENDED LIFE MULTI-BIT MEMORY CELLS

BACKGROUND OF THE INVENTION

The present inventions are related to systems and methods for utilizing multi-bit memory cells, and more particularly to systems and methods for extending the life of multi-bit memory cells.

Flash memories have been used in a variety of devices where information stored by the device must be maintained even when power is lost to the device. A typical flash memory exhibits a number of cells that can be charged to one of $2^N$ distinct voltage levels representing 'N' bits per cell. For example, a two bit cell may be charged to one of four distinct voltage levels each representing a corresponding two bit pattern (i.e., 00, 01, 10, 11). By allowing each cell to represent more than a single bit, the memory density of a given flash device can be increased dramatically for the cost of a few additional comparators and a reasonable increase in write logic. Currently, there is a trend toward further increasing the number of bits that may be stored in any given cell by increasing the number of distinct voltage levels that may be programmed to the cell. For example, there is a trend toward increasing the number of distinct voltage levels to eight so that each cell can hold three data bits. While the process of increasing the number of bits stored to any given flash memory cell allows for increasing bit densities, it can result in a marked decline in the lifecycle of the flash memory. In some cases, this decline in lifecycle of a memory device is unacceptable.

Hence, for at least the aforementioned reason, there exists a need in the art for advanced systems and methods for implementing flash memory devices and/or controllers.

BRIEF SUMMARY OF THE INVENTION

The present inventions are related to systems and methods for utilizing multi-bit memory cells, and more particularly to systems and methods for extending the life of multi-bit memory cells.

Various embodiments of the present invention provide electronic systems that include a plurality of multi-bit memory cells, an encoding circuit and a decoding circuit. Each of the plurality of multi-bit memory cells is operable to hold at least two bits. The encoding circuit is operable to receive a data input including at least two data bits, and to encode the two data bits as an encoded output to the plurality of multi-bit memory cells. The encoded output may be selected to be either a single two bit output representing the two bits, or a series of two two bit outputs representing the two bits. The decoding circuit is operable to reverse the encoding applied by the encoding circuit.

In some instances of the aforementioned embodiments, the encoded output is selected to be the single two bit output representing the two bits. In such instances, selection of the single two bit output representing the two bits results in a tradeoff of increased bit density for decreased lifecycle. In other instances of the aforementioned embodiments, the encoded output is selected to be the series of two two bit outputs representing the two bits. In such an instance, the series of two two bit outputs representing the two bits results in a tradeoff of decreased bit density for increased lifecycle.

In one or more instances of the aforementioned embodiments, the plurality of multi-bit memory cells includes a first subset of the plurality of multi-bit memory cells and a second subset of the plurality of multi-bit memory cells. When the encoded output is destined for the first subset of the plurality of multi-bit memory cells, the encoded output is the single two bit output representing the two data bits. When the encoded output is destined for the second subset of the plurality of multi-bit memory cells, the encoded output is the series of two two bit outputs representing the two data bits.

In various instances of the aforementioned embodiments, each of the plurality of multi-bit memory cells is operable to hold at least three bits, and the data input includes at least three data bits. In such instances, the encoding circuit is operable to encode the three data bits as the encoded output to the plurality of multi-bit memory cells where the encoded output may be a three bit output (three bits organized into a single three bit pattern), a two bit output (two bits organized into two three bit patterns), or a single bit output (three bits organized into three three bit patterns). In some such cases, the encoded output is selected to be the single three bit output representing the three data bits. In such a case, selection of the single three bit output representing the three data bits results in a tradeoff of increased bit density for decreased lifecycle. In other cases, the encoded output is selected to be the series of three three bit outputs representing the three data bits. In such a case, the selection of the series of three three bit outputs representing the three data bits results in a tradeoff of decreased bit density for increased lifecycle.

In various instances, the plurality of multi-bit memory cells includes a first subset of the plurality of multi-bit memory cells and a second subset of the plurality of multi-bit memory cells. When the encoded output is destined for the first subset of the plurality of multi-bit memory cells, the encoded output is the single three bit output representing the three data bits. When the encoded output is destined for the second subset of the plurality of multi-bit memory cells the encoded output is the series of three three bit outputs representing the three data bits.

In one or more instances of the aforementioned embodiments, the plurality of multi-bit memory cells is a plurality of multi-bit flash memory cells. In various instances of the aforementioned embodiments, the plurality of multi-bit memory cells is part of a flash memory system communicably coupled to a processor. In some such instances, the processor may be further communicably coupled to an I/O device, and a random access memory.

Other embodiments of the present invention provide for extending the lifecycle of a memory device. The methods include providing the memory device that includes a plurality of multi-bit memory cells that are each operable to hold at least two bits, receiving a data input, selectably encoding the two data bits as two two bit outputs, and writing the two two bit outputs to two of the plurality of multi-bit memory cells.

In some particular instances of the aforementioned embodiments, each of the plurality of multi-bit memory cells is operable to hold at least three bits, and the data input is a first data input. In such instances, the methods further include receiving a second data input that includes at least three data bits; selectably encoding the three data bits as three three bit outputs; and writing the three three bit outputs to three of the plurality of multi-bit memory cells. In some of the particular instances, the two of the plurality of multi-bit memory cells are included in a first subset of the plurality of multi-bit memory cells, and the three of the plurality of multi-bit memory cells are included in a second subset of the plurality of multi-bit memory cells. In such instances, the first subset of the plurality of multi-bit memory cells is designated for two bit encoding, and the second subset of the plurality of multi-bit memory cells is designated for three bit encoding. In other of the particular instances, the two of the plurality of multi-bit memory cells are included in a first subset of the plurality of multi-bit memory cells, the three of the plurality of multi-bit memory cells are included in a second subset of the plurality of multi-bit memory cells, the first subset of the plurality of multi-bit memory cells is designated for two bit encoding, and the second subset of the plurality of multi-bit memory cells is designated for three bit encoding. In such instances, the methods further include receiving a third data input that includes at least three data bits, and writing the three data bits to one of the plurality of multi-bit memory cells. The one of the plurality of multi-bit cells is part of a third subset of the plurality of multi-bit cells that is designated for one bit encoding. In some cases, writing the three data bits to the one of the plurality of multi-bit memory cells results in a tradeoff of increased bit density for decreased lifecycle. In various cases, encoding the three data bits as three three bit outputs results in a tradeoff of decreased bit density for increased lifecycle. In particular cases, encoding the two data bits as two two bit outputs results in a tradeoff of decreased bit density for increased lifecycle.

Yet other embodiments of the present invention provide memory circuits that include a flash memory device, an encoding circuit and a decoding circuit. The flash memory device includes a plurality of multi-bit memory cells where each of the plurality of multi-bit memory cells is operable to hold at least two bits. The encoding circuit is operable to receive a data input including at least two data bits, and to encode the two data bits as an encoded output to the plurality of multi-bit memory cells. The encoded output may be selected to be either a single two bit output representing the two bits, or a series of two two bit outputs representing the two bits. The decoding circuit is operable to reverse the encoding applied by the encoding circuit.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for utilizing multi-bit memory cells, and more particularly to systems and methods for extending the life of multi-bit memory cells.

Various embodiments of the present invention allow for treating a multi-bit flash memory cell offering one density as a lower density cell. For example a two bit flash memory cell may be treated as a single bit flash memory cell. By treating the cells as lower density cells, the lifecycle of the particular cell is extended as the differentiation between charge levels may be accentuated by using only outer charge levels that can be distinguished from each other across a longer lifecycle. Using the two bit flash memory cell as an example, there are four charge levels each corresponding to a different two bit pattern. In particular, pattern '11' corresponds to a first charge threshold, pattern '10' corresponds to a second charge threshold, pattern '01' corresponds to a third charge threshold, and pattern '00' corresponds to a fourth charge threshold. The difference between the first charge threshold and the fourth charge threshold is substantially greater than the difference between the first charge threshold and the second charge threshold, or the difference between the third charge threshold and the fourth charge threshold. In some cases, all of the charge thresholds are used leading to an increased memory density with a reduced lifecycle. In other cases, only the first threshold and the fourth threshold are used leading to a decreased memory density with an increased lifecycle. It should be noted that while a two bit cell is used as an example, the approach may be extended to higher density memory cells including, but not limited to, three bit memory cells and four bit memory cells.

As a general rule, the lifecycle of a flash memory decreases dramatically each time the bit density per cell increases. Thus, for example, a single bit per cell device may be reliable for 100,000 writes, but a two-bit per cell device may only be reliable for 10,000 writes. In existing memory cells, a single type of memory has been utilized based on a pre-conceived notion that all data is equal. This notion is generally true in some consumer devices such as cameras and audio devices. However, it has determined that in more generalized data scenarios that most data is written and read only a very few times, but that a small portion of data is written and read at a much higher frequency. Various embodiments of the present invention operate to increase flash memory lifecycle by differentiating between the treatment of data with expected uses.

Figure 1:
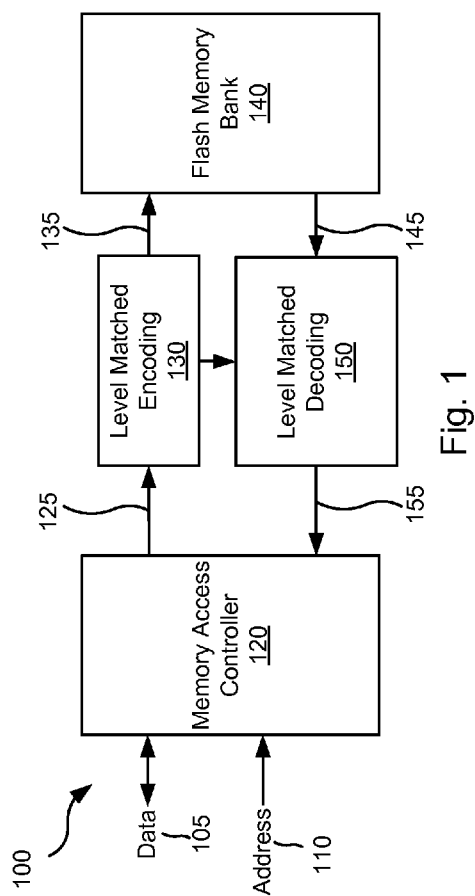
FIG. 1 depicts a flash memory system including a bank of extended life multi-bit flash memory cells in accordance with various embodiments of the present invention.

Turning to FIG. 1, a flash memory system 100 including a flash memory bank 140 with a plurality of extended life multi-bit flash memory cells is shown in accordance with various embodiments of the present invention. Flash memory system 100 includes a memory access controller circuit 120 that receives an address input 110 that selects which location data will be read or written from, and a bidirectional data I/O 105 that receives data to be written and provides data that has been read. Memory access controller circuit 120 determines what level of encoding is to be applied to the data when data is written, and what level of decoding is to be applied when data is read. For example, flash memory bank 140 may offer three level encoding (i.e., flash memory bank 140 has memory cells that are each capable of holding three different bits of data by differentiating between eight threshold levels to yield eight different three bit patterns—'000', '001', '010', '011', '100', '101', '110' and '111'). In this case, different data maintained in flash memory bank 140 may be encoded as one bit cells capable of holding only a single bit per cell, as two bit cells capable of holding two bits per cell, or as three bit cells capable of holding three bits per cell. It should be noted that other embodiments of the present invention may use a flash memory bank including cells having more or fewer levels of encoding.

The determination of whether to encode as one bit, two bit or three bit cells may be made based upon one or more different criteria. For example, where the data being written is read only data that will not be modified, it may be encoded as three bit cell data because the degradation to the cells over time will be limited due to the read only status of the data. As another example, where data is to be written that is expected to be modified frequently, it may be encoded as one bit cell data because the degradation to the cells will be relatively large due to the expected number of overwrites required as data is modified. As another example, data may be encoded as one or two bit cells where it is destined to be written to cells in flash memory bank 140 that is reporting an increased error rate suggesting degradation of the cells. For example, when cells are written with three bit encoding report a high error rate, the cells may be written with two bit encoding requiring differentiation of half of the previous voltage levels. Similarly, when cells are written with two bit encoding report a high error rate, the cells may be written with one bit encoding requiring differentiation of half of the previous voltage levels. Based upon the disclosure provided herein, one of ordinary skill in the art will recognize a variety of basis for determining what level of encoding is to be applied to a given data set.

An output 125 from memory access controller circuit 120 is provided to a level matched encoding circuit 130. Output 125 includes the data to be written as received via bidirectional data I/O 105 along with an indication of the level of encoding to be applied. Level matched encoding circuit 130 applies the determined level of encoding to the received data and provides an output 135 including the encoded data. Using the example where the cells of flash memory bank 140 are each capable of holding three bits of data, the following table identifies the threshold levels used when three bit encoding, two bit encoding or one bit encoding for a given cell of flash memory bank 140. The threshold to the right represents the value written to the cell, and the threshold to the left represents the value of the data bits in the cell.

| Three Bit Threshold Write Levels | Two Bit Threshold Write Levels | One Bit Threshold Write Levels |
|---|---|---|
| '000' => '000' | '00' => '000' | '0' => '000' |
| '001' => '001' | | |
| '010' => '010' | '01' => '011' | |
| '011' => '011' | | |
| '100' => '100' | '10' => '101' | '1' => '111' |
| '101' => '101' | | |
| '110' => '110' | '11' => '111' | |
| '111' => '111' | | |

Thus, where a three bit encoding is determined, the data received as part of output 125 is provided as is to output 135. Where two bit encoding is determined, a '00' data input received as part of output 125 is converted to a '000' write to flash memory bank 140; a '01' data input received as part of output 125 is converted to a '011' write to flash memory bank 140; a '10' data input received as part of output 125 is converted to a '101' write to flash memory bank 140; and a '11' data input received as part of output 125 is converted to a '111' write to flash memory bank 140. Where one bit encoding is determined, a '0' data input received as part of output 125 is converted to a '000' write to flash memory bank 140; and a '1' data input received as part of output 125 is converted to a '111' write to flash memory bank 140. To demonstrate application of the above mentioned encoding, the following table identifies the encoding applied to respective data inputs for a six bit data input where three bit encoding, two bit encoding or one bit encoding is determined for cells of flash memory bank 140:

| Data Input | Three Bit Encoded Output | Two Bit Encoded Output | One Bit Encoded Output |
|---|---|---|---|
| 0000XX | Output 135 is '000', '0XX' | Output 135 is '000', '000', . . . | Output 135 is '000', '000', '000', '000', . . . |
| 0001XX | Output 135 is '000', '1XX' | Output 135 is '000', '011', . . . | Output 135 is '000', '000', '000', '111', . . . |
| 0010XX | Output 135 is '001', '0XX' | Output 135 is '000', '101', . . . | Output 135 is '000', '000', '111', '000', . . . |
| 0011XX | Output 135 is '001', '1XX' | Output 135 is '000', '111', . . . | Output 135 is '000', '000', '111', '111', . . . |
| 0100XX | Output 135 is '010', '0XX' | Output 135 is '011', '000', . . . | Output 135 is '000', '111', '000', '000', . . . |
| 0101XX | Output 135 is '010', '1XX' | Output 135 is '011', '011', . . . | Output 135 is '000', '111', '000', '111', . . . |
| 0110XX | Output 135 is '011', '0XX' | Output 135 is '011', '101', . . . | Output 135 is '000', '111', '111', '000', . . . |
| 0111XX | Output 135 is '011', '1XX' | Output 135 is '011', '111', . . . | Output 135 is '000', '111', '111', '111', . . . |
| 1000XX | Output 135 is '100', '0XX' | Output 135 is '101', '000', . . . | Output 135 is '111', '000', '000', '000', . . . |
| 1001XX | Output 135 is '100', '1XX' | Output 135 is '101', '011', . . . | Output 135 is '111', '000', '000', '111', . . . |
| 1010XX | Output 135 is '101', '0XX' | Output 135 is '101', '101', . . . | Output 135 is '111', '000', '111', '000', . . . |
| 1011XX | Output 135 is '101', '1XX' | Output 135 is '101', '111', . . . | Output 135 is '111', '000', '111', '111', . . . |
| 1100XX | Output 135 is '110', '0XX' | Output 135 is '111', '000', . . . | Output 135 is '111', '111', '000', '000', . . . |
| 1101XX | Output 135 is '110', '1XX' | Output 135 is '111', '011', . . . | Output 135 is '111', '111', '000', '111', . . . |
| 1110XX | Output 135 is '111', '0XX' | Output 135 is '111', '101', . . . | Output 135 is '111', '111', '111', '000', . . . |
| 1111XX | Output 135 is '111', '1XX' | Output 135 is '111', '111', . . . | Output 135 is '111', '111', '111', '111', . . . |

A table of the encoding applied to each cell of flash memory bank 140 by level matched encoding circuit 130 is maintained by a level matched decoding circuit 150. Level match decoding circuit 150 is operable to decode or undo the encoding that was applied by level matched encoding circuit 130. Using the example where the cells of flash memory bank 140 are each capable of holding three bits of data, the following table identifies the threshold levels used when three bit encoding, two bit encoding or one bit encoding for a given cell of flash memory bank 140:

| Three Bit Threshold Read Levels | Two Bit Threshold Read Levels | One Bit Threshold Read Levels |
|---|---|---|
| '000' => '000' | '000' => '00' | '000' => '0' |
| '001' => '001' | '001' => '00' | '001' => '0' |
| '010' => '010' | '010' => '01' | '010' => '0' |
| '011' => '011' | '011' => '01' | '011' => '0' |

| Three Bit Threshold Read Levels | Two Bit Threshold Read Levels | One Bit Threshold Read Levels |
| --- | --- | --- |
| '100' => '100' | '100' => '10' | '100' => '1' |
| '101' => '101' | '101' => '10' | '101' => '1' |
| '110' => '110' | '110' => '11' | '110' => '1' |
| '111' => '111' | '111' => '11' | '111' => '1' |

Thus, where a three bit encoding was used to write the particular cells being read back, the data received from flash memory bank 140 as an output 145 is provided as is as an output 155. Where two bit encoding was used to write the particular cells being read back, any of a '000' or '001' are converted to a '00' that is provided via output 155; any of a '010' or '011' are converted to a '01' that is provided via output 155; any of a '100' or '101' are converted to a '10' that is provided via output 155; and any of a '110' or '111' are converted to a '11' that is provided via output 155. Where one bit encoding is determined, any of a '000', '001', '010', or '011' are converted to a '0' that is provided via output 155; and any of a '100', '101', '110', or '111' are converted to a '1' that is provided via output 155. Output 155 is then provided by memory access controller circuit 120 as data 105.

It should be noted that other encodings may be used depending upon the particular implementation. For example, a three bit per cell device may be encoded as three bits per cell or one bit per cell. In such a case, where one bit encoding is applied a three bit value of '000' may correspond to a single bit '0', and all of three bit values '001', '010', '011', '100', '101', '110' and '111' may correspond to a single bit '1'. As another example, a three bit per cell device may be encoded as three bits per cell or two bits per cell. In such a case, where two bit encoding is applied a three bit value of '000' may correspond to a pattern '00', a three bit value of '001' or a '010' may correspond to a pattern '01', a three bit value of '011' or a '100' may correspond to a pattern '10', and a three bit value of '101', a '110' or a '111' may correspond to a pattern '11'. Based upon the disclosure provided herein, one of ordinary skill in the art will recognize a variety of encodings that may be applied to a given multi-bit memory cell.

Figure 2:
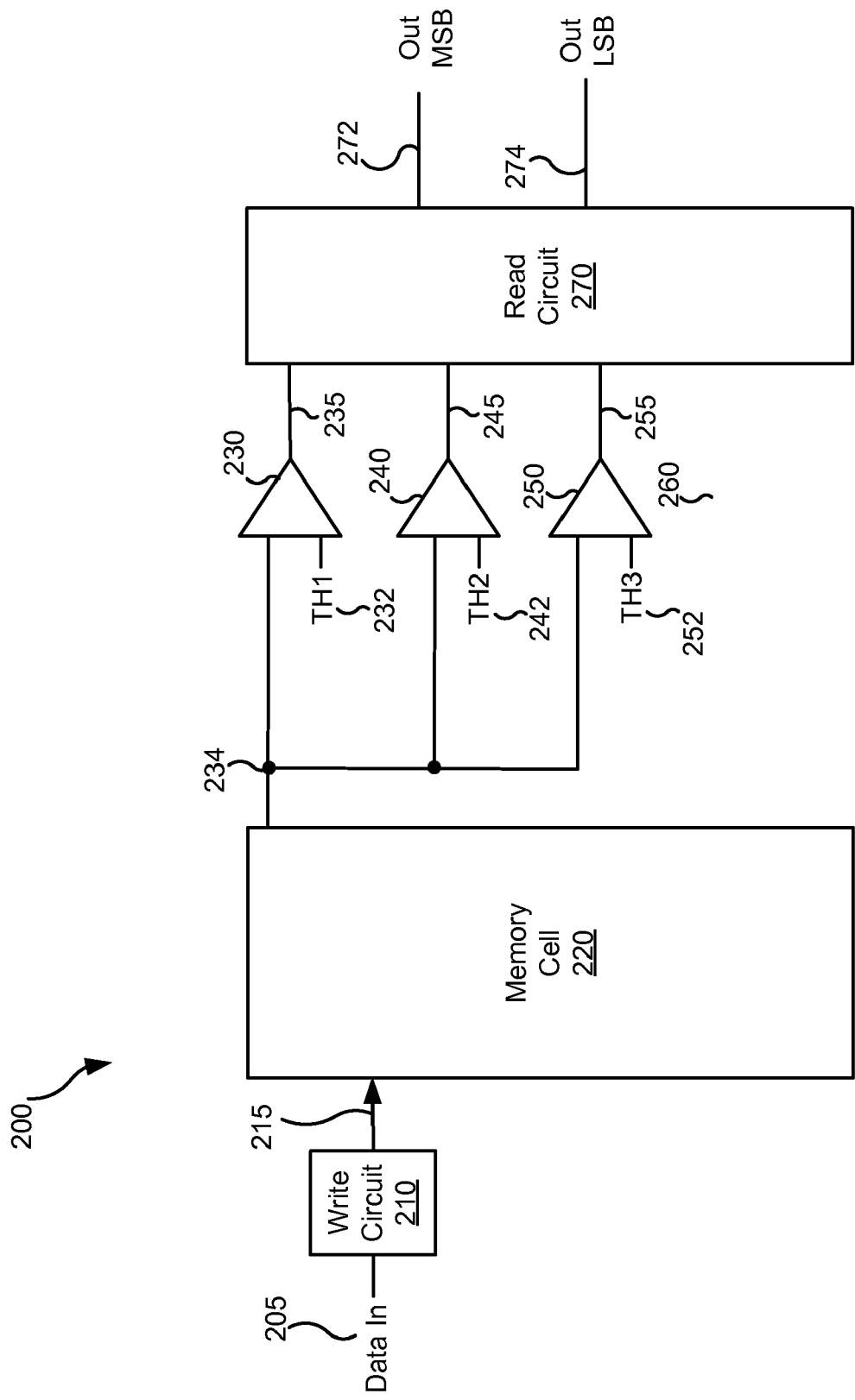
FIG. 2 shows a detailed implementation of a two bit flash memory cell that may be used in relation to the flash memory system of FIG. 1.

Turning to FIG. 2, a detailed implementation of a two bit flash memory cell 200 that may be used in relation to the flash memory system of FIG. 1 is shown. Two bit flash memory cell 200 includes $2^{n-1}$ comparators (i.e., comparators 230, 240, 250) where 'n' is the number of bits per cell. Two bit flash memory cell 200 includes a write circuit 210 that receives a data input 205. Data input 205 is a two bit data input with possible values of '00', '01', '10' and '11'. Write circuit 210 buffers data input 205 and directs a threshold voltage 215 representing data input 205 to memory cell 220. Threshold voltage 215 has four discrete values corresponding to the four possible two bit values that can be stored in memory cell 220. For example, where data input 205 is a '00', voltage threshold 215 is a $V_L$; where data input 205 is a '11', voltage threshold 215 is a $V_H$; where data input 205 is a '10', voltage threshold 215 is a $V_H-V_S$; and where data input 205 is a '01', voltage threshold 215 is a $V_H-2V_S$. In an exemplary case, $V_H-2V_S$ is greater than $V_L$.

When memory cell 220 is to be read, an output voltage threshold 234 is provided in parallel to three comparators 230, 240, 250. Where memory cell 220 is not faulty, output voltage threshold 234 is approximately equal to voltage threshold 215. Where, on the other hand, memory cell 220 has been written and/or read a large number of times, damage resulting in significant leakage may result. In such a case, output voltage threshold 234 may be substantially less than voltage threshold 215. Comparator 230 compares output voltage threshold 234 with a threshold value 232; comparator 240 compares output voltage threshold 234 with a threshold value 242; and comparator 250 compares output voltage threshold 234 with a threshold value 252. The comparisons result in a thermometer output composed of comparator outputs 235, 245, 255. Using the example above, threshold value 232 may be $(V_L+V_H-2V_S)/2$ (i.e., the average of the two threshold values), threshold value 242 may be $(2V_H-3V_S)/2$ (i.e., the average of the two threshold values), and threshold value 252 may be $(2V_H-V_S)/2$ (i.e., the average of the two threshold values). Where output voltage threshold 234 is less than threshold value 232, comparator output 235 is a logic '0', comparator output 245 is a logic '0', and comparator output 255 is a logic '0' resulting in a thermometer output of '000'. This thermometer output is provided to a read circuit 270 that converts the thermometer output into a two bit output with a MSB 272 of a logic '0' and an LSB 274 of a logic '0'. Alternatively, where output voltage threshold 234 is greater than threshold value 232 and less than threshold value 242, comparator output 235 is a logic '1', comparator output 245 is a logic '0', and comparator output 255 is a logic '0' resulting in a thermometer output of '001'. This thermometer output is provided to a read circuit 270 that converts the thermometer output into a two bit output with a MSB 272 of a logic '0' and an LSB 274 of a logic '1'. Alternatively, where output voltage threshold 234 is greater than threshold value 242 and less than threshold value 252, comparator output 235 is a logic '1', comparator output 245 is a logic '1', and comparator output 255 is a logic '0' resulting in a thermometer output of '011'. This thermometer output is provided to a read circuit 270 that converts the thermometer output into a two bit output with a MSB 272 of a logic '1' and an LSB 274 of a logic '0'. Finally, where output voltage threshold 234 is greater than threshold value 252, comparator output 235 is a logic '1', comparator output 245 is a logic '1', and comparator output 255 is a logic '1' resulting in a thermometer output of '111'. This thermometer output is provided to a read circuit 270 that converts the thermometer output into a two bit output with a MSB 272 of a logic '1' and an LSB 274 of a logic '1'.

It should be noted that memory cell 200 can be scaled to larger numbers of bits per cell by increasing the number of comparators used to detect intermediate voltage levels, and by modifying write circuit 210 to make it capable of writing the increased number of thresholds. For example, a three bit memory cell may be created using the same memory cell along with seven comparators (i.e., $2^n-1$ comparators) and a write circuit capable of writing eight threshold values corresponding respectively to '000', '001', '010', '011', '100', '101', '110', and '111'. Similarly, cells capable of holding larger number of bits may be designed by increasing the number of comparators and writable threshold values. The encoding/decoding processes discussed above may be applied to any memory cell capable of holding two or more bits per cell.

Figure 3:
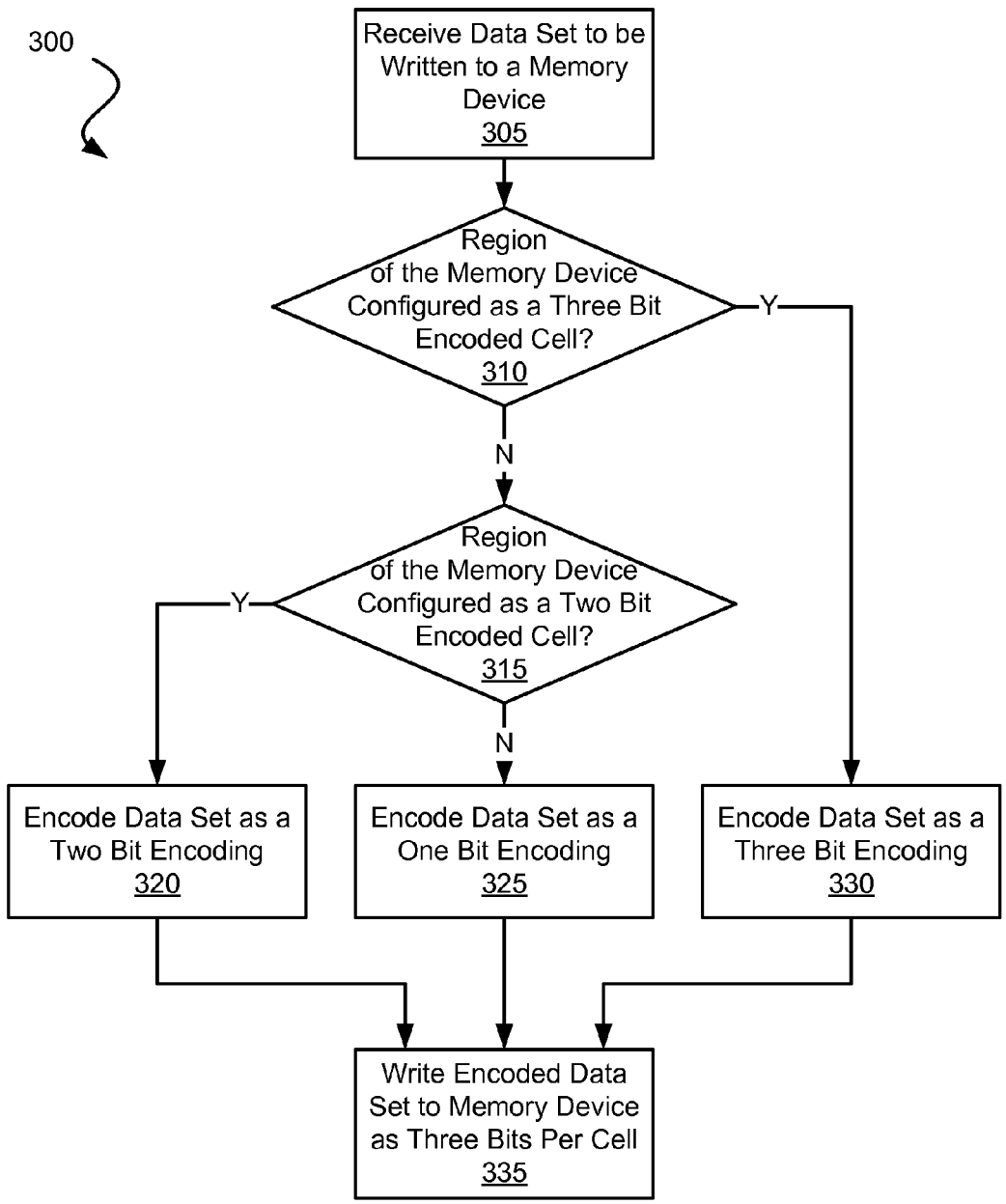
FIG. 3 is a flow diagram of a method in accordance with some embodiments of the present invention for writing data to an extended life, three bit flash memory device.

Turning to FIG. 3, a flow diagram 300 of a method for writing data to an extended life, three bit flash memory device is shown in accordance with some embodiments of the present invention. Following flow diagram 300, a data set is received that is to be written to a memory device (block 305). The data set is a series of digital bits each exhibiting either a logic '1' or a logic '0'. The size of the data set depends on the amount of data to be written to the memory device, and/or the size of any front end write buffering employed by the memory device. In some embodiments, the memory device is a flash memory device capable of storing three bits per memory cell through use of seven threshold comparisons. In other embodiments, the memory device is another type of solid state memory capable of storing three bits per memory cell through use of seven threshold comparisons. Based upon the disclosure provided herein, one of ordinary skill in the art will recognize a variety of memory devices to which the different embodiments disclosed herein may be applied. In particular, it should be noted that a similar method may be applied to a memory device capable of storing two bits per memory cell through use of three threshold comparisons, or more than three bits per memory cell through use of $2^n-1$ comparisons, where n is the number of bits per cell.

It is determined whether the region of the memory device to which the received data is to be written is configured as three bit encoded cells (block 310) or as two bit encoded cells (block 315). As previously discussed, choosing between three bit encoded cells, two bit encoded cells or one bit encoded cells may be done based on a determination of the degradation of a particular cell or block of cells and/or based upon the duration that data is expected to be stored without access. For example, where a cell or block of cells has degraded to the point that it no longer can function as a three bit cell due to an inability to distinguish between eight threshold levels, the cell or block of cells may be converted to a two bit cell or block of cells where only four threshold levels need to be distinguished. As another example, where a cell or block of cells has degraded to the point that it no longer can function as a two bit cell due to an inability to distinguish between four threshold levels, the cell or block of cells may be converted to a one bit cell or block of cells where only two threshold levels need to be distinguished. As another example, where data is not expected to change and/or to be accessed for long periods of time, it may be directed to a cell that is somewhat degraded and at the same time the cell may be treated as a cell capable of handling fewer bits.

Where it is determined that the received data is to be written as three bit encoded data (block 310), the received data is encoded using three bit encoding (block 330). In this case, where the cells of the memory device are designed to hold three bits of data in each cell, such three bit encoding involves writing the received data as is in sets of three bits to respective cells. Alternatively, where it is determined that the received data is to be written as two bit encoded data (block 315), the received data is encoded using two bit encoding (block 325). In this case, where the cells of the memory device are designed to hold three bits of data in each cell, such two bit encoding involves encoding each two bits of the received data in a three bit format such that a reduced number of voltage thresholds in the memory cell are needed. Where neither three bit encoding nor two bit encoding are selected (blocks 310, 315), the received data is encoded using one bit encoding (block 320). In this case, where the cells of the memory device are designed to hold three bits of data in each cell, such one bit encoding involves encoding each bit of the received data in a three bit format such that a reduced number of voltage thresholds in the memory cell are needed.

The following table identifies the threshold levels used when three bit encoding, two bit encoding or one bit encoding for a given cell of flash memory bank 140:

| Three Bit Threshold Write Levels | Two Bit Threshold Write Levels | One Bit Threshold Write Levels |
|---|---|---|
| '000' => '000' | '00' => '000' | '01' => '000' |
| '001' => '001' | | |
| '010' => '010' | '01' => '011' | |
| '011' => '011' | | |
| '100' => '100' | '10' => '101' | '1' => '111' |
| '101' => '101' | | |
| '110' => '110' | '11' => '111' | |
| '111' => '111' | | |

Thus, where a three bit encoding is determined (block 310), the data received is provided as is. Where two bit encoding is determined (block 315), a '00' data input received is converted to a '000' write to the memory device; a '01' data input is converted to a '011' write to the memory device; a '10' data input received is converted to a '101' write to the memory device; and a '11' data input received is converted to a '111' write to the memory device. Where neither three bit encoding nor two bit encoding are determined (blocks 310, 315), a '0' data input received is converted to a '000' write to the memory device; and a '1' data input received is converted to a '111' write to the memory device. To demonstrate application of the above mentioned encoding, the following table identifies the encoding applied to respective data inputs four a six bit data input where three bit encoding, two bit encoding or one bit encoding is determined for cells of the memory device:

| Data Input | Three Bit Encoded Output | Two Bit Encoded Output | One Bit Encoded Output |
|---|---|---|---|
| 0000XX | Output to Memory Device is '000', '0XX' | Output to Memory Device is '000', '000'... | Output to Memory Device is '000', '000', '000', '000'... |
| 0001XX | Output to Memory Device is '000', '0XX' | Output to Memory Device is '000', '011'... | Output to Memory Device is '000', '000', '000', '111'... |
| 0010XX | Output to Memory Device is '001', '0XX' | Output to Memory Device is '000', '101'... | Output to Memory Device is '000', '000', '111', '000'... |
| 0011XX | Output to Memory Device is '001', '1XX' | Output to Memory Device is '000', '111'... | Output to Memory Device is '000', '000', '111', '111'... |
| 0100XX | Output to Memory Device is '010', '0XX' | Output to Memory Device is '011', '000'... | Output to Memory Device is '000', '111', '000', '000'... |
| 0101XX | Output to Memory Device is '010', '1XX' | Output to Memory Device is '011', '011'... | Output to Memory Device is '000', '111', '000', '111'... |
| 0110XX | Output to Memory Device is '011', '0XX' | Output to Memory Device is '011', '101'... | Output to Memory Device is '000', '111', '111', '000'... |
| 0111XX | Output to Memory Device is '011', '1XX' | Output to Memory Device is '111', '111'... | Output to Memory Device is '000', '111', '111', '111'... |
| 1000XX | Output to Memory Device is '100', '0XX' | Output to Memory Device is '101', '000'... | Output to Memory Device is '111', '000', '000', '000'... |
| 1001XX | Output to Memory Device is '100', '1XX' | Output to Memory Device is '101', '011'... | Output to Memory Device is '111', '000', '000', '111'... |
| 1010XX | Output to Memory Device is '101', '0XX' | '101', '101'... | Output to Memory Device is '111', '000', '111', '000'... |
| 1011XX | Output to Memory Device is '101', '1XX' | Output to Memory Device is '101', '111'... | Output to Memory Device is '111', '000', '111', '111'... |
| 1100XX | Output to Memory Device is '110', '0XX' | Output to Memory Device is '111', '000'... | Output to Memory Device is '111', '111', '000', '000'... |
| 1101XX | Output to Memory Device is '110', '1XX' | Output to Memory Device is '111', '011'... | Output to Memory Device is '111', '111', '000', '111'... |

-continued

| Data Input | Three Bit Encoded Output | Two Bit Encoded Output | One Bit Encoded Output |
|---|---|---|---|
| 1110XX | Output to Memory Device is '111', '0XX' | Output to Memory Device is '111', '101'... | Output to Memory Device is '111', '111', '111', '000'... |
| 1111XX | Output to Memory Device is '111', '1XX' | Output to Memory Device is '111', '111'... | Output to Memory Device is '111', '111', '111', '111'... |

Ultimately, the encoded data is written to respective cells of the memory device as three bits per cell (block 335). As will be appreciated, the encoding to extend the lifecycle of a memory device can be done without a change to the memory cells and surrounding support circuitry.

Figure 4:
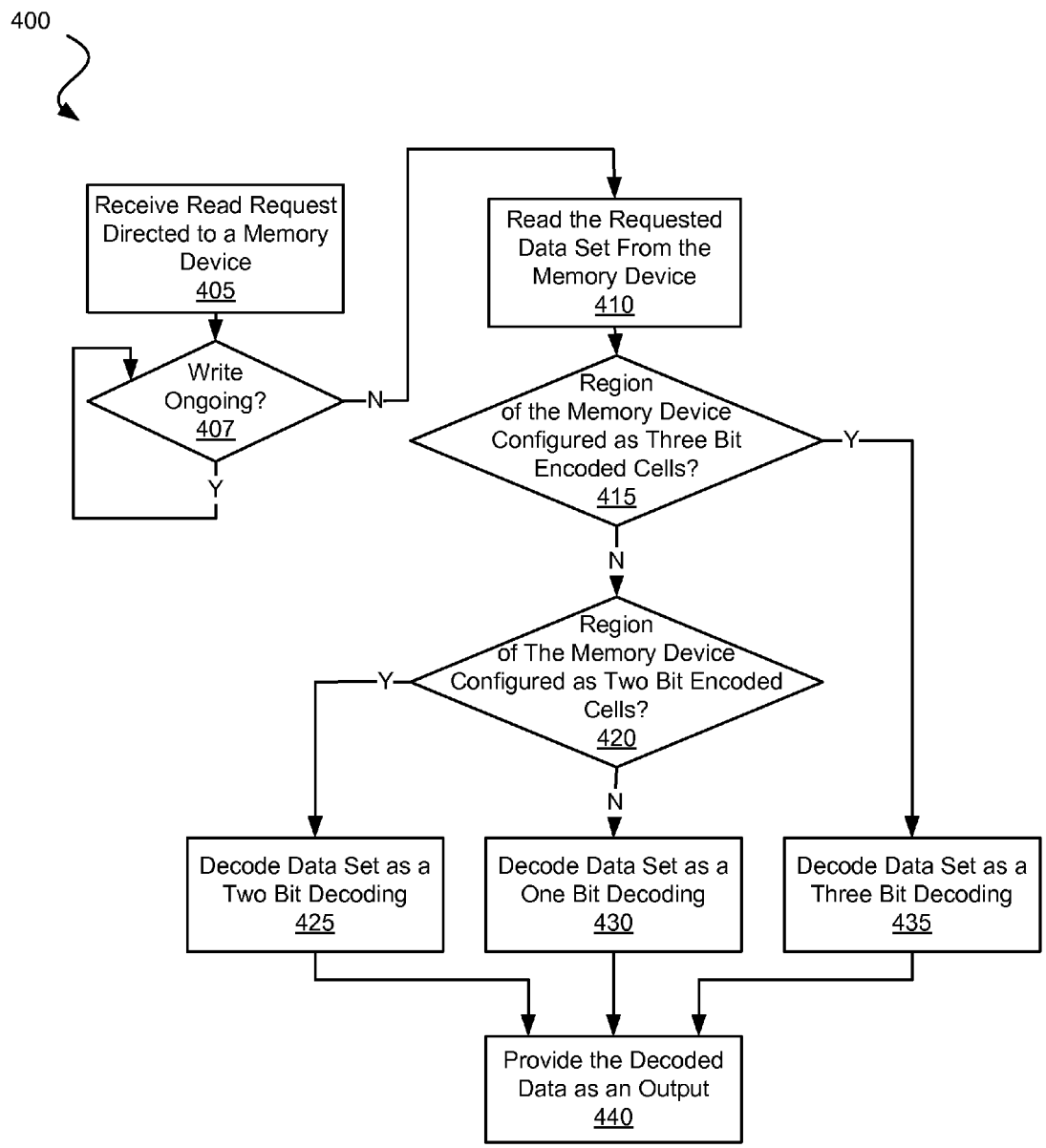
FIG. 4 is a flow diagram of a method in accordance with some embodiments of the present invention for reading data from to an extended life, three bit flash memory device.

Turning to FIG. 4, a flow diagram 400 depicts a method in accordance with some embodiments of the present invention for reading data from to an extended life, three bit flash memory device. Following flow diagram 400, a request to read data from the that is directed to a memory device (block 405). The request may include, for example, an address of data that is to be retrieved from the memory device. It is determined whether a write to the memory device is currently ongoing (block 407). Where a write is currently ongoing (block 407), completion of the write is awaited. If either a write was not ongoing or a previously ongoing write has completed (block 407), the requested data set is read from the memory device (block 410). The read data includes detecting a voltage threshold for each memory cell read and converting the magnitude of the voltage threshold into a three bit pattern. This process is repeated across a number of memory cells resulting in a series of three bit patterns.

It is then determined whether the region of the memory device from which the series of three bit patterns are derived is configured as three bit encoded cells (block 415) or as two bit encoded cells (block 420). This determination may be made, for example, by maintaining a table indicating the encoding applied to different regions of the memory device. This same table may be used when writing data to the memory device so that the appropriate encoding can be applied. Where it is determined that the read data was originally encoded as three bit encoded cells (block 415), the received series of three bit patterns is decoded using three bit decoding (block 435). The three bit decoding is substantially the reverse of the three bit decoding discussed above. In this case, where the cells of the memory device are designed to hold three bits of data in each cell, such three bit decoding does not require any change to the received series of three bit patterns. Alternatively, where it is determined that the read data was originally encoded as two bit encoded cells (block 420), the received series of three bit patterns is decoded using three bit decoding (block 425). In this case, where the cells of the memory device are designed to hold three bits of data in each cell, such two bit decoding involves decoding each of the three bit patterns to yield the corresponding two bit pattern. Where neither three bit encoding nor two bit encoding are selected (blocks 415, 420), the received data is decoded using one bit encoding (block 430). In this case, where the cells of the memory device are designed to hold three bits of data in each cell, such one bit decoding involves decoding each of the three bit patterns to yield the corresponding one bit pattern.

The following table describes the decoding process for a memory device including three bit cells. The following table identifies the threshold levels used when three bit decoding, two bit decoding or one bit decoding for a given cell of the memory device:

| Three Bit Threshold Read Levels | Two Bit Threshold Read Levels | One Bit Threshold Read Levels |
|---|---|---|
| '000' => '000' | '000' => '00' | '000' => '0' |
| '001' => '001' | '001' => '00' | '001' => '0' |
| '010' => '010' | '010' => '01' | '010' => '0' |
| '011' => '011' | '011' => '01' | '011' => '0' |
| '100' => '100' | '100' => '10' | '100' => '1' |
| '101' => '101' | '101' => '10' | '101' => '1' |
| '110' => '110' | '110' => '11' | '110' => '1' |
| '111' => '111' | '111' => '11' | '111' => '1' |

Thus, where a three bit encoding was used to write the particular cells being read back, each three bit pattern of the data received from the memory device is provided as is as a series of three bit patterns. Where two bit encoding was used to write the particular cells being read back, any of a '000' or '001' are converted to a '00' that is provided as an output; any of a '010' or '011' are converted to a '01' that is provided as an output; any of a '100' or '101' are converted to a '10' that is provided as an output; and any of a '110' or '111' are converted to a '11' that is provided as an output. Where one bit encoding is determined, any of a '000', '001', '010', or '011' are converted to a '0' that is provided as an output; and any of a '100', '101', '110', or '111' are converted to a '1' that is provided as an output. Ultimately, the decoded data is provided as an output (block 440).

Figure 5:
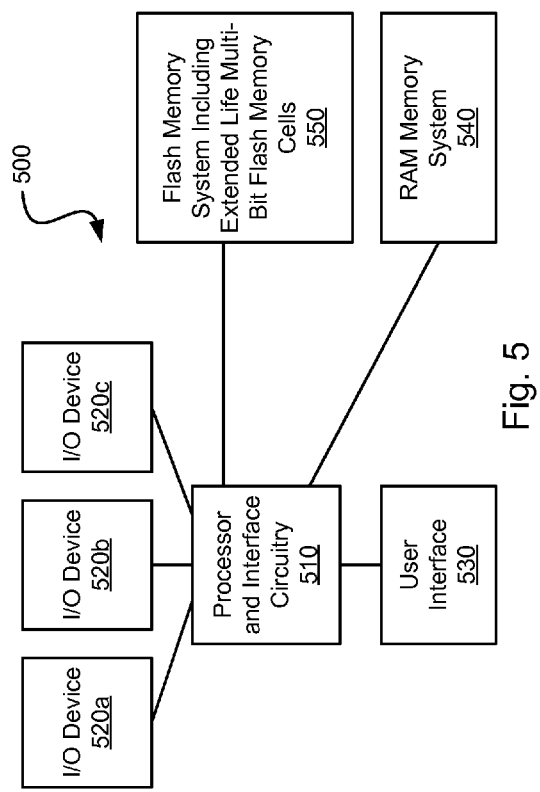
FIG. 5 shows an electronic system including a flash memory system with extended life multi-bit flash memory cells in accordance with one or more embodiments of the present invention.

Turning to FIG. 5, an electronic system 500 including a flash memory system 550 with extended life multi-bit flash memory cells in accordance with one or more embodiments of the present invention. In addition to flash memory system 550, electronic system 500 includes a processor with interface circuitry 510 that is communicably coupled to one or more I/O devices 520 and a user interface 530. In addition, processor 510 is communicably coupled to a non-flash random access memory 540. In one particular implementation, electronic system 500 is a personal computer where I/O devices 520 may include, but are not limited to, a keyboard, a mouse, a touch screen or the like. In such a case, user interface 530 may be a display. Random access memory 540 may hold a variety of instructions that are executable by processor 510 to cause particular actions to take place.

In one embodiment of the present invention, random access memory 540 includes instructions executable by processor 510 to determine a characteristic of the received data set, and to select an encoding level based upon the determined characteristic. For example, where the data type is a document, it may be considered to be more likely to be frequently accessed than if it was a very large document. The storage density for a frequently accessed document is selected to be lower than that of a less frequently accessed document as the more frequently accessed data will accrue greater wear to the memory cells that store the data. Thus, for example, a data set from a document that is frequently accessed may be written as one bit per cell in comparison to another document that is expected to be less frequently accessed may be written as three bits per cell. As another example, where the data set is part of a read only data file, the storage density may be selected to be the highest density as reading data from memory cells in some cases is less damaging than writing data to memory cells. As yet another example, the data set may be of a type that is not typically written. Such data types include, but are not limited to, movie or audio format data. In such a case, the data may be treated similarly to that discussed above in relation to read only data. Such a data type determination may be made based upon a data file extension such as, for example, *.avi, *.mpg, or the like. Based upon the disclosure provided herein, one of ordinary skill in the art will recognize a variety of determinations that may be made to establish an assumed data characteristic that corresponds to the expected frequency that the data may be written and/or read, and for selecting a storage density based upon the determined characteristics. Based upon the disclosure provided herein, one of ordinary skill in the art will recognize a variety of implementations of electronic system 500.

Flash memory system 550 may be implemented to include the ability to encode data stored in the memory such that fewer thresholds must be distinguished. As such, the memory density may be reduced in exchange for increasing the lifecycle of the memory or a portion thereof. In some cases, flash memory system 550 may be replaced by flash memory system 100 discussed above in relation to FIG. 1, and may include a number of memory cells similar to that discussed above in relation to FIG. 2. Of note, flash memory system 550 may be implemented using memory devices that are operable to hold two or more bits per cell, with the encoding/decoding process being used to tradeoff between the number of bits per cell and the life expectancy of the device or region of the device. In some cases, accesses to flash memory 550 may be done consistent with the approaches discussed above in relation to FIG. 3 and FIG. 4.

Based upon the disclosure provided herein, one of ordinary skill in the art will recognize that different embodiments of the present invention can be implemented without modifying commercially available memory devices including, but not limited to, flash memory devices. Thus, where a higher bit density reduced lifecycle device can be modified for use as a lower bit density increased lifecycle device by encoding data written to the memory device and decoding data received from the memory device. Such an approach advantageously allows for varying design requirements that can be implemented using only one or a limited number of flash memory types. The aforementioned approach results in economies of scale and reduced cost per bit of a given memory device. Of note, the processes of encoding data provided to memory cells in accordance with different embodiments of the present invention can be replicated for devices offering larger numbers of bits per cell. For example, a device having cells that are designed to hold three bits per cell can be written either as one bit per cell, where maximum lifetime is required, two-bit cells or three bit cells depending upon the desired lifecycle. The same approach for encoding and decoding information can be used to exchange bit density for increased lifecycle. The different embodiments disclosed herein may also be extended to include using multiple cells for a single bit of information where the reliability of the data is the highest priority. Similar to mirroring two Storages devices for redundancy, this method, while lowering the density of the device, increases the reliability.

It has been determined that the lifecycle of a given multilevel flash memory device can be increased with only a moderate reduction in bit density where some cells are written using a lower density write approach and other cells are written using higher density write approaches. Various embodiments of the present invention balance the density of memory cells based upon the characteristics of the data directed to the cell. Data that would be expected to be accessed at a high frequency is written to lower density memory cells that offer the greatest lifecycle at the expense of reduced data density (i.e., reduced number of effective bits per cell), while data that would be expected to be accessed relatively infrequently is written to higher density memory cells that offer greater data density (i.e., increased number of effective bits per cell) as the expense of decreased lifecycle. As such, the rate at which any cell in the memory ages may be more closely related to the rate of aging of other cells.

Figure 6:
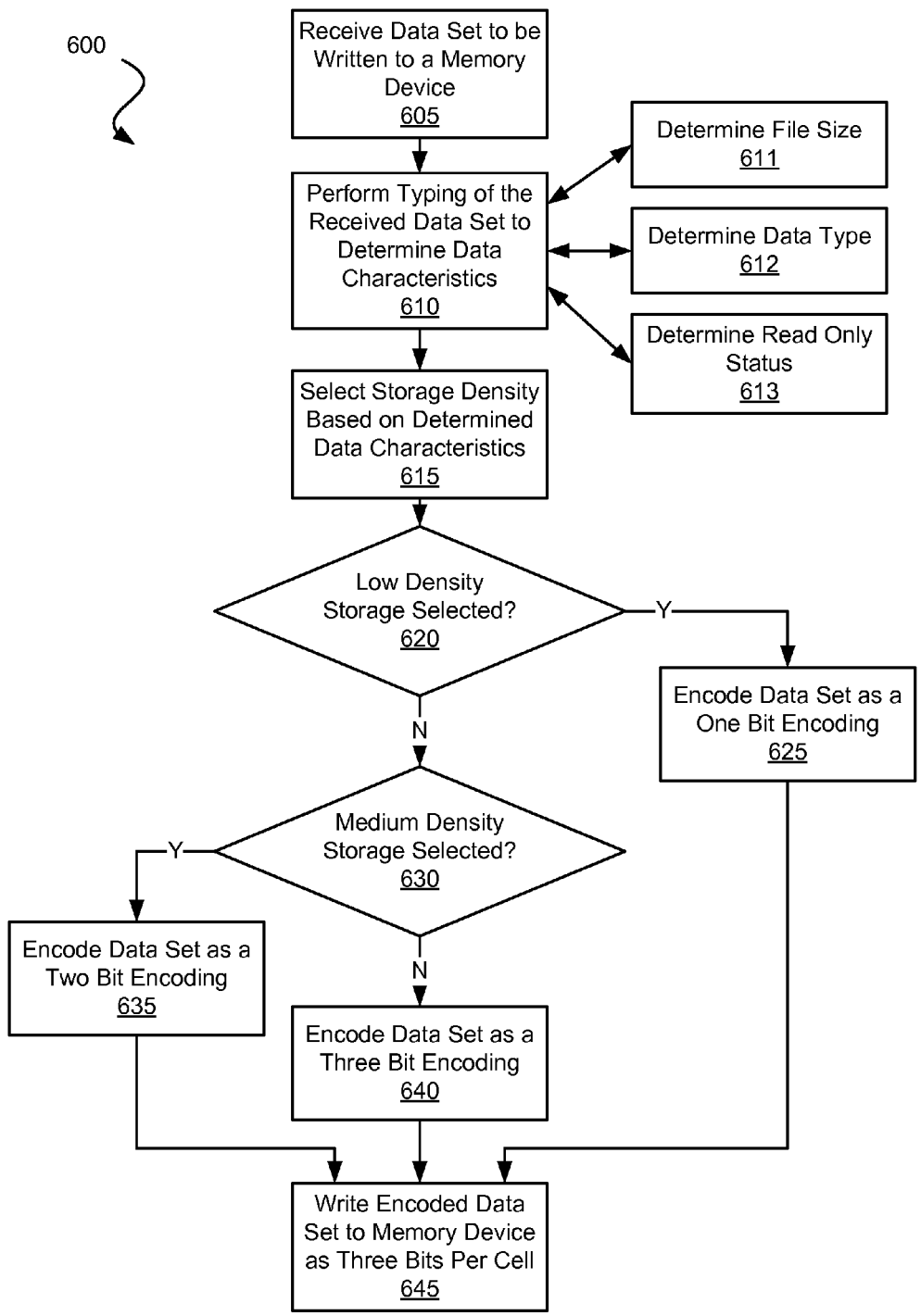
FIG. 6 is a flow diagram of a method in accordance with some embodiments of the present invention for selecting the number of bits to be represented by memory cells of a three bit memory device.

Turning to FIG. 6, a flow diagram 600 depicts a method in accordance with some embodiments of the present invention for selecting the number of bits to be represented by memory cells of a three bit memory device. Following flow diagram 600, a data set is received that is to be written to a memory device (block 605). The data set is a series of digital bits each exhibiting either a logic '1' or a logic '0'. The size of the data set depends on the amount of data to be written to the memory device, and/or the size of any front end write buffering employed by the memory device. Further, the data set is of a particular type such as, for example, the data set may be a movie format file (e.g., an MPEG file or an AVI file), a document file (e.g., a TEXT file or a WORD file), or other file types as are known in the art. In addition, the data set may include various properties such as, for example, a read only property. In some embodiments, the memory device is a flash memory device capable of storing three bits per memory cell through use of seven threshold comparisons. In other embodiments, the memory device is another type of solid state memory capable of storing three bits per memory cell through use of seven threshold comparisons. Based upon the disclosure provided herein, one of ordinary skill in the art will recognize a variety of memory devices to which the different embodiments disclosed herein may be applied and/or data set characteristics that may be utilized in accordance with different embodiments of the present invention. In particular, it should be noted that a similar method may be applied to a memory device capable of storing two bits per memory cell through use of three threshold comparisons, or more than three bits per memory cell through use of $2^n-1$ comparisons, where 'n' is the number of bits per cell.

A typing of the data set is then performed to determine one or more relevant data set characteristics (block 610). Such typing may include, but is not limited to, a determination of the size of file that the data set is associated with (block 611), a determination of the data type (e.g., movie file, audio file, document file) (block 612), and a determination of a read only characteristic of the data set (block 613). Using the determined characteristics, a storage density for the data set is selected (block 615). For example, where the data type is a document, it may be considered to be more likely to be frequently accessed than if it was a very large document. The storage density for a frequently accessed document is selected to be lower than that of a less frequently accessed document as the more frequently accessed data will accrue greater wear to the memory cells that store the data. Thus, for example, a data set from a document that is frequently accessed may be written as one bit per cell in comparison to another document that is expected to be less frequently accessed may be written as three bits per cell. As another example, where the data set is part of a read only data file, the storage density may be selected to be the highest density as reading data from memory cells in some cases is less damaging than writing data to memory cells. As yet another example, the data set may be of a type that is not typically written. Such data types include, but are not limited to, movie or audio format data. In such a case, the data may be treated similarly to that discussed above in relation to read only data. Such a data type determination may be made based upon a data file extension such as, for example, *.avi, *.mpg, or the like. Based upon the disclosure provided herein, one of ordinary skill in the art will recognize a variety of determinations that may be made to establish an assumed data characteristic that corresponds to the expected frequency that the data may be written and/or read, and for selecting a storage density based upon the determined characteristics.

Where the storage density for the data has been selected to be low density (i.e., the frequency at which the data will be accessed is high) (block 620), the data set is encoded using one bit encoding as discussed above (block 625). The one bit encoded data set is then written to the memory device as three bit data (block 645). Alternatively, where the storage density for the data has been selected to be a medium density (i.e., the frequency at which the data will be accessed is average) (block 630), the data set is encoded using two bit encoding as discussed above (block 635). The two bit encoded data set is then written to the memory device as three bit data (block 645). As yet another alternative, where the storage density for the data has been selected to be a high density (i.e., the frequency at which the data will be accessed is low) (block 630), the data set is encoded using three bit encoding as discussed above (block 640). The three bit encoded data set is then written to the memory device as three bit data (block 645). The balance between low, medium and high density storage density selection may be modified depending upon the particular implementation. It should be noted that flow diagram 600 is described in relation to a three bit per cell memory, but that the same approach can be extended to memories offering two bits per cell, or four or more bits per cell.

In conclusion, the invention provides novel systems, devices, methods and arrangements for extended life operation of multi-bit memory cells. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An electronic system, the system comprising:
    a plurality of multi-bit memory cells, wherein each of the plurality of multi-bit memory cells is operable to hold at least two bits, and wherein the plurality of multi-bit memory cells includes a first subset of the plurality of multi-bit memory cells and a second subset of the plurality of multi-bit memory cells;
    an encoding circuit, wherein the encoding circuit is operable to receive a data input including at least two data bits, and to encode the two data bits as an encoded output to the plurality of multi-bit memory cells, wherein when the encoded output is destined for the first subset of the plurality of multi-bit memory cells the encoded output is a single two bit output representing the two data bits, and wherein when the encoded output is destined for the second subset of the plurality of multi-bit memory cells the encoded output is the series of two two bit outputs representing the two data bits; and
    a decoding circuit, wherein the decoding circuit is operable to reverse the encoding applied by the encoding circuit.

2. The electronic system of claim 1, wherein the encoded output is selected to be the single two bit output representing the two data bits, and wherein selection of the single two bit output representing the two data bits results in a tradeoff of increased bit density for decreased lifecycle.

3. The electronic system of claim 1, wherein the encoded output is selected to be the series of two two bit outputs representing the two data bits, and wherein selection of the series of two two bit outputs representing the two data bits results in a tradeoff of decreased bit density for increased lifecycle.

4. The electronics system of claim 1, wherein the plurality of multi-bit memory cells is a plurality of multi-bit flash memory cells.

5. The electronics system of claim 1, wherein the plurality of multi-bit memory cells is part of a flash memory system communicably coupled to a processor.

6. The electronics system of claim 5, wherein the processor is further communicably coupled to:
    an I/O device, and
    a random access memory.

7. A method for extending the lifecycle of a memory device, the method comprising:
    providing the memory device, wherein the memory device includes a plurality of multi-bit memory cells, and wherein each of the plurality of multi-bit memory cells is operable to hold at least three bits;
    receiving a first data input, wherein the first data input includes at least two data bits;
    selectably encoding the two data bits of the first data input as two two bit outputs;
    writing the two two bit outputs to two of the plurality of multi-bit memory cells;
    receiving a second data input, wherein the second data input includes at least three data bits;
    selectably encoding the three data bits as three three bit outputs; and
    writing the three three bit outputs to three of the plurality of multi-bit memory cells; and
    wherein the two of the plurality of multi-bit memory cells are included in a first subset of the plurality of multi-bit memory cells, wherein the three of the plurality of multi-bit memory cells are included in a second subset of the plurality of multi-bit memory cells, wherein the first subset of the plurality of multi-bit memory cells is designated for two bit encoding, and wherein the second subset of the plurality of multi-bit memory cells is designated for three bit encoding.

8. The method of claim 7, wherein the method further comprises:
    receiving a third data input, wherein the third data input includes at least three data bits; and
    writing the three data bits to one of the plurality of multi-bit memory cells, wherein the one of the plurality of multi-bit cells is part of a third subset of the plurality of multi-bit cells that is designated for one bit encoding.

9. The method of claim 8, wherein writing the three data bits to the one of the plurality of multi-bit memory cells results in a tradeoff of increased bit density for decreased lifecycle.

10. The method of claim 7, wherein the encoding the three data bits as three three bit outputs results in a tradeoff of decreased bit density for increased lifecycle.

11. The method of claim 7, wherein the encoding the two data bits as two two bit outputs results in a tradeoff of decreased bit density for increased lifecycle.

12. A memory circuit, the memory circuit comprising:
    a flash memory device, wherein the flash memory device includes a plurality of multi-bit memory cells, and wherein each of the plurality of multi-bit memory cells is operable to hold at least two bits, and wherein the plurality of multi-bit memory cells includes a first subset of the plurality of multi-bit memory cells and a second subset of the plurality of multi-bit memory cells;
    an encoding circuit, wherein the encoding circuit is operable to receive a data input including at least two data bits, and to encode the two data bits as an encoded output to the plurality of multi-bit memory cells, wherein when the encoded output is destined for the first subset of the plurality of multi-bit memory cells the encoded output is a single two bit output representing the two data bits, and wherein when the encoded output is destined for the second subset of the plurality of multi-bit memory cells the encoded output is the series of two two bit outputs representing the two data bits; and a decoding circuit, wherein the decoding circuit is operable to reverse the encoding applied by the encoding circuit.

13. The memory circuit of claim 12, wherein the encoded output is selected to be the single two bit output representing the two data bits, and wherein selection of the single two bit output representing the two data bits results in a tradeoff of increased bit density for decreased lifecycle.

14. The memory circuit of claim 12, wherein the encoded output is selected to be the series of two two bit outputs representing the two data bits, and wherein selection of the series of two two bit outputs representing the two data bits results in a tradeoff of decreased bit density for increased lifecycle.

15. An electronic system, the system comprising:
a plurality of multi-bit memory cells, wherein each of the plurality of multi-bit memory cells is operable to hold at least three bits, and wherein the plurality of multi-bit memory cells includes a first subset of the plurality of multi-bit memory cells and a second subset of the plurality of multi-bit memory cells;
an encoding circuit, wherein the encoding circuit is operable to receive a data input including at least three data bits, and to encode the three data bits as an encoded output to the plurality of multi-bit memory cells, wherein when the encoded output is destined for the first subset of the plurality of multi-bit memory cells the encoded output is a single three bit output representing the three data bits, and wherein when the encoded output is destined for the second subset of the plurality of multi-bit memory cells the encoded output is selected from a group consisting of: a series of three three bit outputs representing the three data bits, and a series of three two bit outputs representing the three data bits.

16. The electronic system of claim 15, wherein the plurality of multi-bit memory cells is a plurality of multi-bit flash memory cells.

17. The electronic system of claim 15, wherein the plurality of multi-bit memory cells is part of a flash memory system communicably coupled to a processor, and wherein the processor is further communicably coupled to:
an I/O device, and
a random access memory.

18. The electronic system of claim 15, wherein the encoded output is selected to be single three bit output representing the three data bits, and wherein selection of the single three bit output representing the three data bits results in a tradeoff of increased bit density for decreased lifecycle.

19. The electronic system of claim 15, wherein the encoded output is selected to be the series of three three bit outputs representing the three data bits, and wherein selection of the series of three three bit outputs representing the three data bits results in a tradeoff of decreased bit density for increased lifecycle.

20. The electronic system of claim 15, wherein when the encoded output is destined for the second subset of the plurality of multi-bit memory cells the encoded output is the series of three three bit outputs representing the three data bits.

* * * * *